United States Patent [19]

McDonald

[11] Patent Number: 4,611,123
[45] Date of Patent: Sep. 9, 1986

[54] HIGH VOLTAGE ANALOG SOLID STATE SWITCH

[75] Inventor: Duncan R. McDonald, Mountain View, Calif.

[73] Assignee: Fairchild Camera and Instrument Corporation, San Jose, Calif.

[21] Appl. No.: 452,607

[22] Filed: Dec. 23, 1982

[51] Int. Cl.[4] .............................................. G02B 27/00
[52] U.S. Cl. .................................... 250/551; 307/311; 361/173
[58] Field of Search ................ 250/551; 361/173, 172; 307/311; 455/618, 619

[56] References Cited

U.S. PATENT DOCUMENTS

| | | | |
|---|---|---|---|
| 4,227,098 | 10/1980 | Brown et al. .......................... | 307/311 |
| 4,295,226 | 10/1981 | Dombrowski ........................ | 455/618 |
| 4,307,298 | 12/1981 | El Hamamsy ........................ | 250/551 |
| 4,355,237 | 10/1982 | Harris .................................... | 250/551 |
| 4,390,790 | 6/1983 | Rodriguez ............................ | 250/551 |
| 4,419,586 | 12/1983 | Phipps .................................. | 250/551 |

Primary Examiner—John K. Corbin
Assistant Examiner—R. Eyssalleane
Attorney, Agent, or Firm—Theodore S. Park; Robert C. Colwell

[57] ABSTRACT

A high voltage analog solid state switch is disclosed which includes a pair of MOS FET's 10 and 20 having commonly coupled sources 11 and 21 and commonly coupled gates 13 and 23. A photovoltaic generator 30 and an opto-coupler 40 are connected in parallel between the commonly coupled gates and sources. The input node is connected to the drain of one transistor 10 while an output node is connected to the drain of the other transistor 20. The switch is turned on by application of light 32 to generator 30 to thereby positively bias the gates 13 and 23 and cause transistors 10 and 20 to conduct. The switch is turned off by application of light 42 to coupler 40 to thereby short the commonly coupled sources 11 and 21 to the commonly coupled gates 13 and 23.

7 Claims, 3 Drawing Figures

HIGH VOLTAGE ANALOG SOLID STATE SWITCH

BACKGROUND OF THE INVENTION

1. Field of the Invention

This invention relates to high voltage solid state switches, and in particular, to a high voltage solid solid state switch in which a pair of series connected field effect transistors are turned on by a photovoltaic generator and turned off by an opto-coupler. The invention is particularly suited for use in automatic test equipment for the testing of integrated circuits.

2. Description of the Prior Art

In automatic test equipment for the testing of integrated circuits and other electronic components, pin electronics interface circuits are coupled to the pins or other nodes of an electronic device being tested. Through the pins, stimuli signals are applied to the device under test, and output signals from the device under test are detected and measured. Usually the stimuli signals represent logic states or analog voltages or currents which are desired to be impressed upon the pins of the device under test as a parallel pattern, with the resulting output signals checked in parallel. In typical prior art systems the switching of drivers, comparators, and other circuits to the pins of the device being tested has been accomplished using mechanical relays, for example, a three Form A relay.

The use of relays for switching in automatic test equipment results in a number of disadvantages, primarily because relays operate at relatively slow switching speeds. The slow switching speed, on the order of hundreds of microseconds, results in substantial dead time for the automatic test equipment. In some state of the art test equipment about one-half of the tester dead time is spent waiting for relays to close.

SUMMARY OF THE INVENTION

This invention provides a high voltage analog solid state switch with improved operating characteristics over the relays previously used to perform voltage switching in automatic test systems. The switch of this invention provides two series connected DMOS FET's which are turned on by a photovoltaic generator and turned off by an opto-coupler. The invention requires only a low voltage power supply to turn on light emitting diodes used to drive the photovoltaic generator and the opto-coupler. Because the switch itself is floating with no electrical path to ground or to the input driver, there is very low leakage and high electrical isolation from input to output. Furthermore, no external high voltage power supplies are required for biasing. The invention may be fabricated in a module which is pin-for-pin compatible with the relays it replaces, yet switches orders of magnitude faster than the relays. This substantially reduces tester dead time permitting greater throughput for the automatic test equipment.

In one embodiment a switch for selectively connecting an input node to an output node comprises first and second MOS transistors each having gate, source, and drain electrodes, the input node being connected to the drain of the first transistor and the output node being connected to the drain of the second transistor, the gates of the transistors being connected to a first node, and the sources of the transistors being connected to a second node; photovoltaic generating means connected between the first node and the second node for generating a potential difference therebetween in response to a first signal; and optocoupling means connected between the first node and the second node for connecting the first node to the second node in response to a second signal.

DETAILED DESCRIPTION OF THE PREFERRED EMBODIMENT

Figure 1:
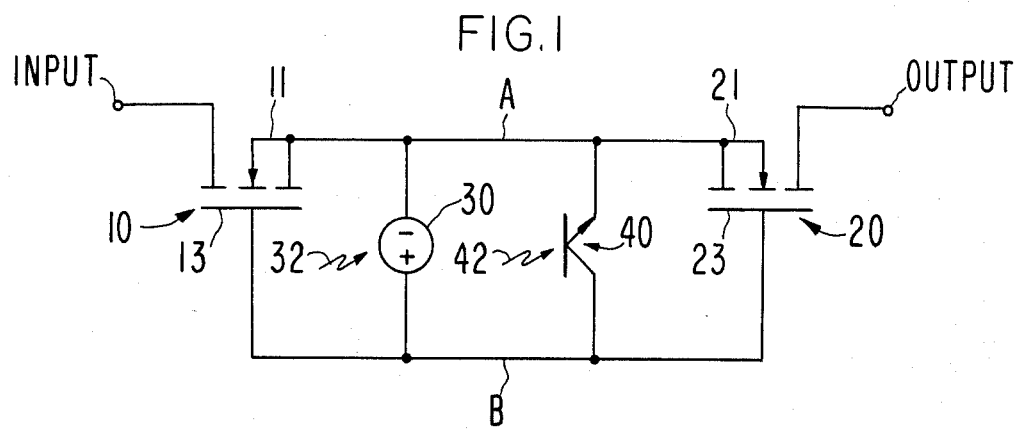
FIG. 1 is a schematic drawing of the preferred embodiment of the switch of this invention.

FIG. 1 is a schematic diagram of the preferred embodiment of the high voltage analog solid state switch of this invention. The circuit shown in FIG. 1 functions to selectively connect and disconnect the input node, shown on the left side of FIG. 1, from the output node shown on the right-hand side of FIG. 1. The circuit includes first 10 and second 20 metal oxide semiconductor (MOS) field effect transistors (FET). The sources 11 and 21 of the transistors are connected together at node A, and the gates 13 and 23 are connected together at node B. A photovoltaic generator 30 is connected between nodes A and B, in parallel with an opto-coupler 40.

Photovoltaic generator 30 may be any commercially available photovoltaic generator which, in response to appropriate illumination, will create a potential difference between nodes A and B. In the preferred embodiment generator 30 comprises a Fairchild FPC 400. A Dionics D-16V8 integrated circuit which consists of 16 series connected photovoltaic diodes may also be employed. The diodes are dielectrically isolated from each other and from their common substrate. Under illumination the generator 30 will generate a potential of 6 to 8 volts depending upon of the intensity and source of light.

Opto-coupler 40 is also of a well-known design, and in the preferred embodiment comprises a photosensitive transistor manufactured by Fairchild as product MCT-6, which in response to appropriate illumination will short node A to node B. The activating light for generator 30 is schematically illustrated by arrow 32 in FIG. 1, while the activating light for opto-coupler 40 is illustrated by arrow 42.

The operation of the circuit shown in FIG. 1, when the transistors 10 and 20 comprise enhancement mode n channel D-MOS devices, is as follows. Transistors 10 and 20 will not conduct unless the potential of their gates 13 and 23, respectively, is more positive than the potential of the channel between the source and drain. Assuming no light is striking opto-coupler 40 it will be off, and the potential difference between nodes A and B will be determined by generator 30. Thus, in response to light 32, generator 30 will establish a potential difference between nodes A and B, with node B being more positive. This condition turns on transistors 10 and 20 and connects the input node to the output node.

If it is desired to disconnect the input node from the output node, then light 32 will be turned off and light 42 turned on. In this manner the generator 30 will not establish any potential difference between nodes A and B, while the opto-coupler 40 will short the nodes together, turning transistors 10 and 20 off.

Figure 2:
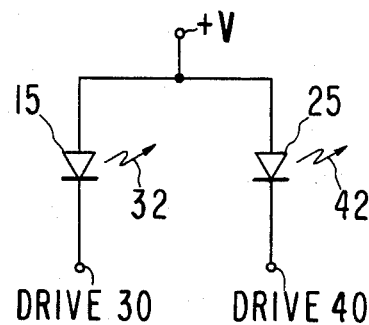
FIG. 2 is a schematic drawing illustrating a control circuit for the circuit shown in FIG. 1.

FIG. 2 is a simplified schematic diagram of one control circuit which may be used in conjunction with the circuit shown in FIG. 1. As shown in FIG. 2 a pair of light emitting diodes 15 and 25 are connected to receive an appropriate control signal. Upon application of a control signal "drive 30" light emitting diode 15 will turn on, to cause it to emit light 32, and thereby drive generator 30. Application of control signal "drive 40" will turn on light emitting diode 25 causing it to emit light 42 to turn on opto-coupler 40. Of course generator 30 and coupler 40 will be optically isolated from each other so that control signals for one are not received by the other.

Figure 3:
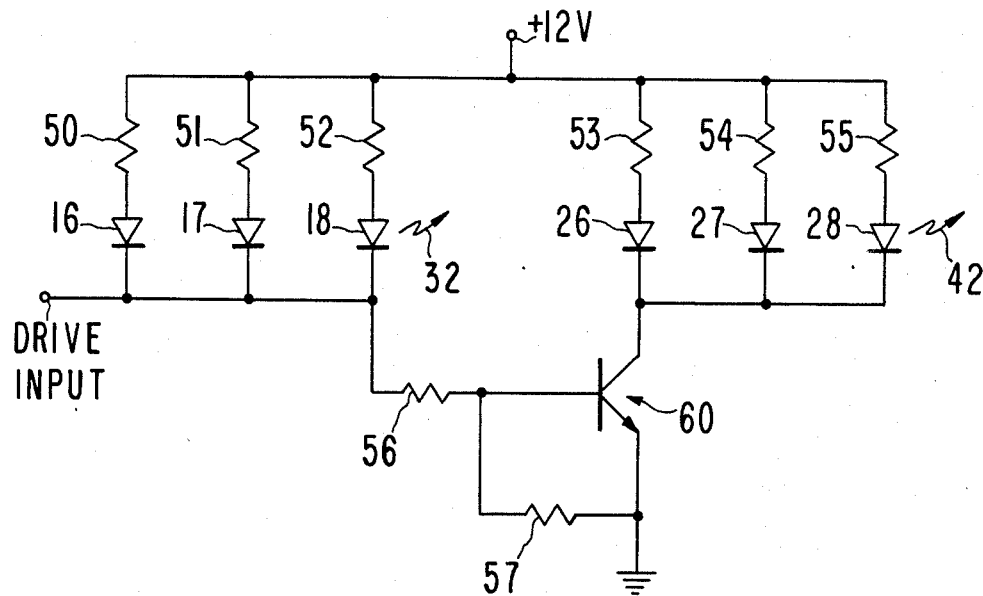
FIG. 3 is a schematic drawing illustrating a control circuit for the circuit of FIG. 1 when used in an automatic test system.

FIG. 3 is a schematic drawing of a control circuit for use in automatic test equipment. The control circuit shown in FIG. 3 may be used to control three of the high voltage solid state switches depicted in FIG. 1. In a typical embodiment light emitting diodes 16, 17, and 18 will be used to control three separate photovoltaic generators such as generator 30 in FIG. 1, while light emitting diodes 26, 27, and 28 will be used to control three separate opto-couplers, such as opto-coupler 40 shown in FIG. 1. A typical application in automatic test equipment would be to drive a Kelvin connected voltage source with high impedance sense line and driven guard. As shown by FIG. 3 application of a low drive input signal will turn on diodes 16, 17, and 18 and, via transistor 60, turn off diodes 26, 27, and 28. Thus the switches being controlled will be turned on. Application of a high drive input signal will turn off diodes 16, 17, and 18, and turn on diodes 26, 27, and 28 to thereby drive the opto-couplers and turn off the three circuits. In the preferred embodiment of FIG. 3 the light emitting diodes comprise MCT6 diodes, resistors 50 through 55 are 330 ohms, resistor 56 is 10k ohms, and resistor 57 is 6.8k ohms. Transistor 60 is a 2N4401 transistor.

Although preferred embodiments of the high voltage analog solid state switch of this invention and accompanying control circuits have been described above, these embodiments are intended to illustrate the invention rather than limit it. In particular, it will be appreciated that other types of transistors may be used in place of the enhancement mode n-MOS devices shown. It should also be appreciated that other types of photovoltaic generators and opto-couplers may be used in place of those described. The scope of the invention may be ascertained from the appended claims.

I claim:

1. A switch for selectively connecting an input node to an output node comprising:

a first source of a first signal;
   a second source of a second signal;
   first and second MOS transistors each having gate, source and drain electrodes, the input node being connected to the drain of the first transistor and the output node being connected to the drain of the second transistor, the gates of the transistors being connected to a first node, and the sources of the transistors being connected to a second node;
   photovoltaic generating means connected between the first node and the second node for generating a potential difference therebetween in response to the first signal;
   a photosensitive bipolar transistor having an emitter and a collector coupled between the first node and the second node, the photosensitive bipolar transistor for electrically shorting the first node to the second node in response to the second signal;
   first and second potential sources;
   a control bipolar transistor having a base coupled to receive a control signal, a collector and an emitter;
   wherein the first source is connected between the potential source and the base of the control bipolar transistor;
   the second source is connected between the first potential source and the collector of the control bipolar transistor;
   the emitter of the control bipolar transistor is connected to the second potential source; and
   whereby when the control signal is of a first level the first source is turned on and the second source is turned off, and when the control signal is of a second level the first source is turned off and the second source is turned on.

2. A switch as in claim 1 wherein the MOS transistors comprise enhancement mode transistors.

3. A switch as in claim 1 wherein the photovoltaic generating means comprises apparatus for generating a potential difference between the first node and the second node in response to visible electromagnetic radiation.

4. A switch as in claim 1 wherein the first source comprises at least one first light-emitting diode.

5. A switch as in claim 4 wherein the second source comprises at least one second light-emitting diode.

6. A switch as in claim 4 wherein the first signal comprises light from the at least one first light-emitting diode.

7. A switch as in claim 6 wherein the second signal comprises light from the at least one second light-emitting diode.

* * * * *